(12) United States Patent
Rachala

(10) Patent No.: US 11,264,998 B1
(45) Date of Patent: Mar. 1, 2022

(54) REFERENCE FREE AND TEMPERATURE INDEPENDENT VOLTAGE-TO-DIGITAL CONVERTER

(71) Applicant: Advanced Micro Devices, Inc., Santa Clara, CA (US)

(72) Inventor: Ravinder Reddy Rachala, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/031,763

(22) Filed: Sep. 24, 2020

(51) Int. Cl.
*H03L 7/099* (2006.01)
*H03L 7/08* (2006.01)
*G06F 1/04* (2006.01)

(52) U.S. Cl.
CPC .............. *H03L 7/0996* (2013.01); *G06F 1/04* (2013.01); *H03L 7/0802* (2013.01)

(58) Field of Classification Search
CPC ........ H03L 7/0802; H03L 7/0996; G06F 1/04
USPC ................................................. 327/156, 158
See application file for complete search history.

(56) References Cited

U.S. PATENT DOCUMENTS

| | | | |
|---|---|---|---|
| 7,257,678 B2 | 8/2007 | Golden et al. | |
| 7,577,859 B2 | 8/2009 | Bilak | |
| 9,671,767 B2 | 6/2017 | Naffziger et al. | |
| 10,018,674 B2 | 7/2018 | Honkote et al. | |
| 10,060,955 B2 | 8/2018 | Grenat et al. | |
| 2010/0225402 A1 | 9/2010 | Yang et al. | |
| 2016/0248414 A1* | 8/2016 | Vilangudipitchai | H03K 17/04206 |
| 2018/0034452 A1* | 2/2018 | Lu | G01R 31/31725 |
| 2019/0317547 A1* | 10/2019 | Savoj | H03K 3/0315 |

OTHER PUBLICATIONS

Katoh, et al., "Time-to-Digital Converter-Based Maximum Delay Sensor for On-Line Timing Error Detection in Logic Block of Very Large Scale Integration Circuits", Sensors and Materials, vol. 27, No. 10 (2015), pp. 933-943.

\* cited by examiner

*Primary Examiner* — John W Poos
(74) *Attorney, Agent, or Firm* — Kowert Hood Munyon Rankin and Goetzel PC; Rory D. Rankin

(57) ABSTRACT

A system and method for measuring power supply variations are described. A functional unit includes one or more power supply monitors capable of measuring power supply variations. The power supply monitors forego use of a clock signal from clock generating circuitry and forego use of a reference voltage from a reference power supply. The power supply monitors use an output of a source ring oscillator as a clock signal for the sequential elements of a counter. The counter measures a number of revolutions of a measuring ring oscillator within a period of the output of the source oscillator. The revolutions of the measuring ring oscillator are associated with a number of rising edges and falling edges of the output signal of the measuring ring oscillator. An encoder converts the output of the sequential elements to a binary value, and sends the binary value to an external age tracking unit.

20 Claims, 9 Drawing Sheets

REFERENCE FREE AND TEMPERATURE INDEPENDENT VOLTAGE-TO-DIGITAL CONVERTER

BACKGROUND

Description of the Relevant Art

Both planar transistors (devices) and non-planar transistors are fabricated for use in integrated circuits within semiconductor chips. A variety of choices exist for placing processing circuitry in system packaging to integrate the multiple types of integrated circuits. Some examples are a system-on-a-chip (SOC), multi-chip modules (MCMs) and a system-in-package (SiP). Mobile devices, desktop systems and servers use these packages. Regardless of the choice for system packaging, in several uses, both power consumption and voltage droop of modern integrated circuits have become an increasing design issue with each generation of semiconductor chips.

Advances in semiconductor fabrication techniques have been reducing transistor dimensions in order to increase both performance and functionality within the same amount of space. The supply voltages for the integrated circuits have been scaling down to reduce both power consumption and short channel effects. Superscalar designs increase the density of integrated circuits on a die with multiple pipelines, larger caches, and more complex logic. Therefore, the number of nodes and buses that may switch per clock cycle significantly increases.

A simultaneous switching of a wide bus may cause a significant voltage drop if a supply pin served all of the line buffers on the bus. Parasitic inductance increases transmission line effects on a chip such as ringing and reduced propagation delays. The resulting voltage droop is proportional to the expression L di/dt, wherein L is the parasitic inductance and di/dt is the time rate of change of the current consumption. Now a node that holds a logic high value may experience a voltage droop that reduces its voltage value below a minimum threshold. For memories and latches without recovery circuitry, stored values may be lost. Power supply currents flowing through non-zero resistance wires also create an IR (current-resistance) voltage drop, which contributes to data retention corruption and timing failures in critical paths.

In addition to IR voltage droop and parasitic inductance voltage droop, aging of circuits contributes to data retention corruption and timing failures in critical paths. One example of aging is negative bias temperature instability (NBTI). Any solution placed in the integrated circuits is dependent on detecting degradation effects. Therefore, sensors and monitors are placed in integrated circuits to measure degradation effects of signals and routes within the integrated circuits. However, sensors and monitors are environment dependent. For example, ambient temperature alters the measurements by sensors and monitors. Additionally, when a clock signal is used for measurement, clock jitter negatively affects the measurements.

In view of the above, efficient methods and mechanisms for measuring power supply variations are desired.

Figure 1:
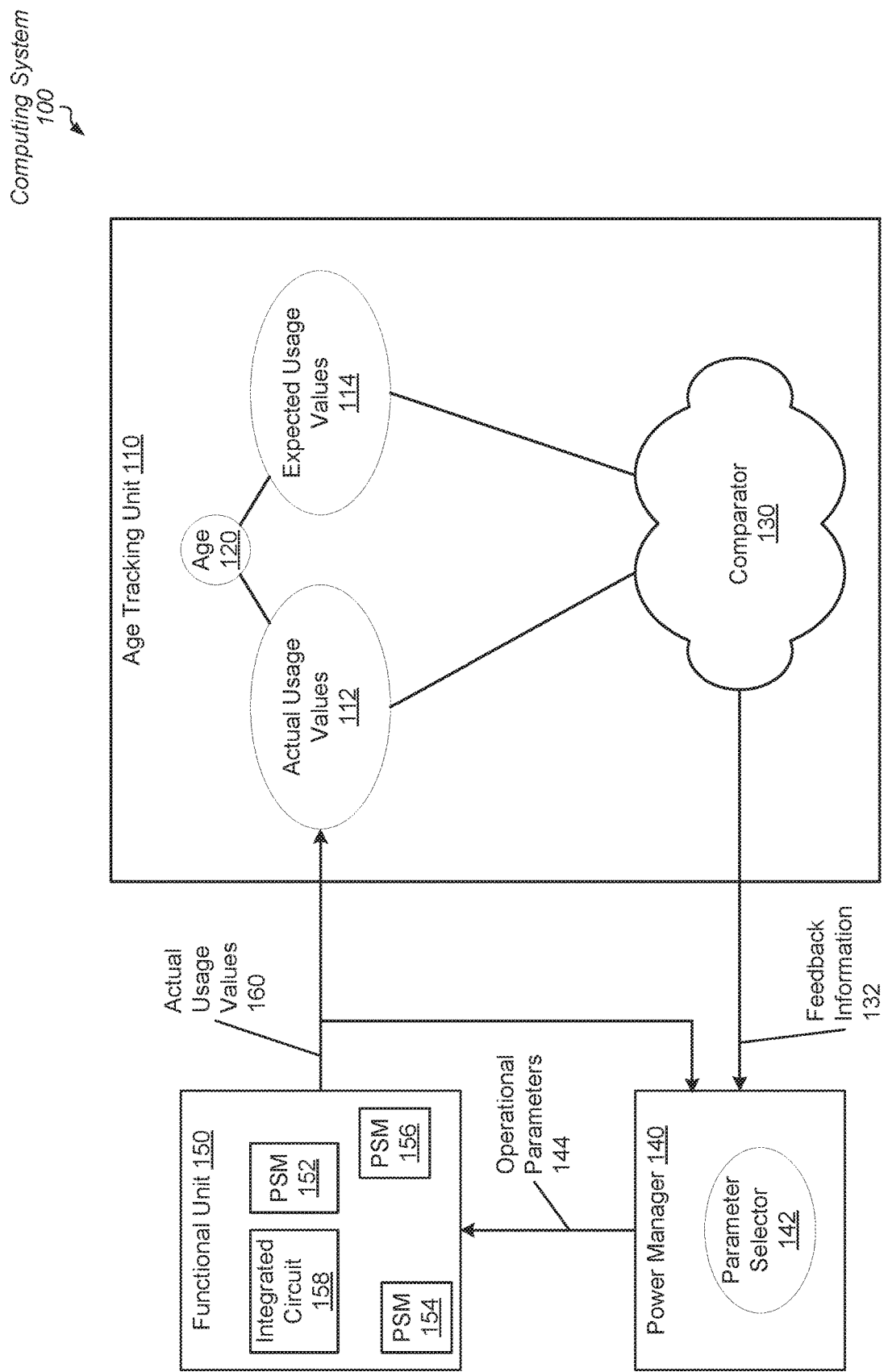
FIG. 1 is a generalized diagram of one embodiment of a computing system.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for measuring power supply variations are contemplated. A functional unit is representative of any processing unit capable of performing tasks corresponding to processing software applications, handling input/output (I/O) requests, and other tasks of a computing system. Examples of the functional unit are a general-purpose central processing unit (CPU), a field programmable gate arrays (FPGA), an application specific integrated circuit (ASIC), a parallel data processor such as a processor with a single instruction multiple data (SIMD) microarchitecture or a digital signal processor (DSP), and so forth. The functional unit has one or more power supply monitors placed in regions across the functional unit. A power supply monitor measures an operational voltage reference (power supply voltage) in a particular region of the functional unit. As used herein, the "operating voltage reference" is also referred to as the "power supply voltage." In one example, the region is a processor core of multiple processor cores and controllers and interfaces of the functional unit. In another example, the region is a region within the processor core, which uses multiple power supply monitors. Other regions, such as within a memory controller, an interface unit, or other, are possible and contemplated.

The power supply monitor measures an average operational voltage reference over a particular time period and generates an indication of a count corresponding to the measured operational voltage reference. A mapping exists that relates the count determined over the particular time period to values of operating voltage references. In various embodiments, the power supply monitor is implemented as a time-to-digital converter (TDC). The power supply monitor measures the operational voltage reference and generates the indication of the count while foregoing use of a clock signal from clock generating circuitry. For example, the power supply monitor foregoes use of a toggling signal derived from an output of a phase locked loop (PLL) or other clock generating circuitry. Therefore, the power supply monitor reduces the dependence on temperature variations for the power supply voltage measurement. Additionally, the power supply monitor removes dependence on jitter of a clock signal generated by clock generating circuitry. Further, the power supply monitor foregoes use of a second power supply voltage used as a reference voltage.

Further still, the power supply monitor is capable of measuring an operational voltage reference and generating the indication of the count prior to a clock signal being generated by clock generating circuitry. For example, as soon as the power supply is provided to the functional unit, the power supply monitor begins measuring the operational voltage reference and storing a state in sequential elements that indicates the count corresponding to the measured operational voltage reference. Rather than use a clock signal provided by clock generating circuitry, such as a phase locked loop (PLL) or other, the power supply monitor uses an output of a ring oscillator as a clock signal for the sequential elements of the counter. This ring oscillator may be referred to as a source ring oscillator.

The power supply monitor also uses another ring oscillator, which may be referred to as the measuring ring oscillator. The sequential elements of the counter store a state of the output of one or more stages of the measuring ring oscillator. The output signal of the source ring oscillator is used as the clock input signal for these sequential elements. Therefore, the counter counts a number of cycles of the output signal of the final stage of the measuring ring oscillator within a period of the output signal of the source oscillator. In other words, the counter counts a number of revolutions of the measuring ring oscillator within a period, or "clock cycle," of the output of the source ring oscillator. Therefore, the counter counts a number of rising and falling edges of the output of the measuring ring oscillator within a period of the output of the source oscillator. The output of the sequential elements are sent to an encoder, which converts the output of the sequential elements to a binary value. The encoder sends the binary value to an external age tracking unit, which determines whether to update one or more operating parameters of the functional unit based on a comparison of the received binary value and an expected value.

Turning to FIG. 1, a generalized block diagram of one embodiment of a computing system 100 is shown. As shown, the computing system 100 includes a functional unit 150, an age tracking unit 110 and a power manager 140. The functional unit 150 is representative of any circuitry with its own voltage and clock domain. The functional unit 150 conveys actual usage values 160 to each of the age tracking unit 110 and the power manager 140. Examples of the actual usage values 160 are operational parameters such as a clock frequency and a power supply voltage. Other examples of the actual usage values 160 are an activity level of the circuitry, an operational current, outputs of one or more temperature sensors and current sensors, and an estimation of power consumption. In some designs, the estimation of power consumption uses weighted values of particular sampled signals of the functional unit 150. The age tracking unit 110 receives and stores the actual usage values 112 when a particular time interval elapses. The comparator 130 compares the received actual usage values 112 to the expected usage values 114 to generate the feedback information 132. The parameter selector 142, within the power manager 140, uses the feedback information 132 from the age tracking unit 110 to select operational parameters 144 for the functional unit 150.

In some embodiments, the functional unit 150 is representative of a processing unit, a general-purpose central processing unit (CPU) complex, a graphics processing unit (GPU), or another parallel data processor such as a digital signal processing (DSP) core, a field programmable gate array (FPGA), an application specific integrated circuit (ASIC), and so forth. As described earlier, the functional unit 150 is representative of any circuitry with its own voltage and clock domain. For example, the functional unit 150 can be a memory controller, an input/output (I/O) hub controller, or other. A single voltage and clock domain is discussed here for ease of illustration. In some embodiments, an age tracking unit 110 is used for a particular voltage and clock domain. In other embodiments, an age tracking unit 110 is used for multiple voltage and clock domains.

A variety of choices exist for placing the circuitry of the computing system 100 in system packaging to integrate the multiple types of integrated circuits. Some examples are a system-on-a-chip (SOC), multi-chip modules (MCMs) and a system-in-package (SiP). Mobile devices, desktop systems and servers use these packages and the functionality of the computing system 100. Clock sources, such as phase lock loops (PLLs), interrupt controllers, power controllers, memory controllers, interfaces for input/output (I/O) devices, and so forth are not shown in FIG. 1 for ease of illustration. It is also noted that the number of components of the computing system 100 and the number of subcomponents for those shown in FIG. 1, such as within the functional unit 150, the age tracking unit 110 and the power manager 140, may vary from embodiment to embodiment. There may be more or fewer of each component/subcomponent than the number shown for the computing system 100.

Although it is shown that the parameter selector 142 determines the operational parameters of the functional unit 150, in other embodiments, other units receive the operational parameters 144, and determine values for the operational parameters to provide to the functional unit 150. In yet other embodiments, the age tracking unit 110 sends feedback information 132 directly to these other units, rather than to the power manager 140. These values of the operational parameters 144 are used by the functional unit 150 until a next event occurs that causes the value to be updated. Examples of these events are one or more of an update of the feedback information 132, an update of a power-performance state (P-state), a detection that a particular time interval has elapsed, and so forth. One example of these other units is an on-die voltage regulator unit used to generate the power supply voltage by modulating a resistance such that the operational voltage reference being output from a voltage rail is maintained at a determined voltage. The determined voltage is based on a measured voltage droop. Similarly, calibration circuitry of the on-die voltage rails of the functional unit 150 adjusts the operational voltage based on receiving an indication of voltage droop.

Another example of these other units determining values for the operational parameters to provide to the functional unit 150 is an adaptive clocking unit. The adaptive clocking unit reduces the operational clock frequency based on an indication of an amount of voltage droop. Yet another example of these other units is a reliability monitor used to monitor aging effects, predict a remaining life span of the functional unit 150, and/or make adjustments of the operating parameters to prolong the life span of the functional unit 150. It is possible that any one of these units are used in tandem with the power manager 140. It is also possible that any one of the above configurations describing the interconnections of units is used in the computing system 100 based on design requirements. Although the below discussion describes the parameter selector 142 setting the operational parameters 144 for use by the functional unit 150, it is possible and contemplated that one or more of the above other units and other configurations is used in computing system 100.

It is possible for the operating power supply voltage of the functional unit 150 to vary from an expected value over time. In addition to IR voltage droop and parasitic inductance voltage droop, aging of circuits contributes to data retention corruption and timing failures in critical paths of the functional unit 150. One example of aging is negative bias temperature instability (NBTI). Another example is time-dependent dielectric breakdown (TDDB), which occurs when the gate oxide breaks down as a result of long-time application of a relatively low electric field being applied over a long duration. The breakdown is caused by formation of electron tunneling current forms a conducting path through the gate oxide to the substrate. Typically, the metal oxide semiconductor (MOS) field effect transistor (FET) is operating near or beyond its specified operating voltage. Another type of circuit failure occurs when electromigration gradually moves ions in a conductor during applications of high current densities. For example, copper or other traces used as long conducting wires for an appreciable amount of time experience diffusing metal atoms. As transistor widths and trace widths decrease, the effects of electromigration increase.

The computing system 100 can be used in medical equipment, automotive systems such as anti-lock braking systems, banking and business-critical storage and processing systems, space travel systems and so forth. Due to the difficulty of testing under real conditions, equations anticipating the use and worst-case conditions were used to predict the life span of integrated circuits. For example, the integrated circuits in the functional unit 150 may have gone through high temperature operating life testing and the expected life span under real conditions was extrapolated from data gathered during the testing. However, the age tracking unit 110 replaces the anticipated use approach and provides real-time feedback under real usage conditions to monitor and adjust usage to satisfy a reliability target and take advantage of available performance.

To update a power supply voltage of the operating parameters 144 due to voltage droop, the functional unit 150 provides a measurement of an operational voltage reference (power supply voltage) as part of the actual usage values 160 to the age tracking unit 110. The comparator 130 determines a power supply variation using the received measured operational voltage reference. The functional unit 150 uses multiple power supply monitors (PSMs) 152, 154 and 156, which provide measured operational voltage references as part of the actual usage values 160 in a region. In one example, a region is an area of the semiconductor die of the functional unit 150 that includes one of a variety of integrated circuits such as integrated circuit 158. Examples of the integrated circuit 158 are a processor core (or core) of multiple processor cores, a memory controller, an interface unit, an arithmetic logic unit, and a variety of other types of integrated circuits. Although functional unit 150 is shown to include a single integrated circuit 158 and three power supply monitors 152-156 for measuring operational voltage references in three regions, in other embodiments, the functional unit 150 uses another number of integrated circuits and power supply monitors.

The power supply monitors 152-156 forego the use of a clock signal from clock generating circuitry, such as a phased locked loop, and forego use of a reference voltage from a reference power supply. The power supply monitors 152-156 use an output of a source ring oscillator as a clock signal for the sequential elements of a counter. The counter measures a number of revolutions of a measuring ring oscillator within a period of the output of the source oscillator. The revolutions of the measuring ring oscillator are associated with a number of rising edges and falling edges of the output signal of the measuring ring oscillator. A mapping exists that relates the count determined over a particular time period to values of operating voltage references. In various embodiments, the power supply monitors 152-156 are implemented as time-to-digital converters (TDCs). An encoder converts the output of the sequential elements to a binary value, and sends the binary value to the age tracking unit 110. The age tracking unit 110 uses the received count and a copy of the mapping to determine a measurement of the operating voltage reference from the received count. Since the power supply monitors 152-156 use the output of the source ring oscillator as a clock signal for the sequential elements of a counter, the power supply monitors 152-156 reduce the dependence on temperature variations for the power supply measurement. Additionally, the power supply monitors 152-156 remove dependence of power supply voltage measurements on jitter of a clock signal generated by clock generating circuitry. Further, the power supply monitors 152-156 remove dependence of power supply voltage measurements on circuit aging effects.

One or more of the actual usage values 112 and the expected usage values 114 depends on an age 120 of the functional unit 150. For example, if a reliability target for the computing system 100 is a lifespan of at least five years, then multiple expected usage values over a duration are set based on the reliability target of the five year lifespan. The expected usage values 114 correspond to an age 120 of the functional unit 150. In some embodiments, the functional unit 150 provides an indication of age with the actual usage values to the age tracking unit 110. In other embodiments, the age tracking unit 110 maintains the age 120. In some embodiments, the age tracking unit 110 uses a timestamp value to maintain the age. In other embodiments, the age tracking unit 110 uses one or more counters to maintain the age. One counter can be incremented hourly and roll over at the end of a 24 hour period, whereas other counters are incremented daily, weekly, monthly and annually. In such a case, the concatenation of the counter values provides an age of the functional unit 150. In other embodiments, software, such as the operating system, maintains the age of the functional unit 150.

In some embodiments, the expected usage values 114 are stored in a lookup table with a copy stored in non-volatile memory. The lookup table may store a local copy of the expected usage values 114, and the lookup table is implemented by registers, flip-flop circuits, one of a variety of random access memories, a content addressable memory (CAM), and so forth. The age tracking unit 110 receives and stores the actual usage values 112 when a particular time interval elapses, and the comparator 130 within the age tracking unit 110 compares the actual usage values 112 and the expected usage values 114. The comparison performed by the comparator 130 determines whether the usage of the functional unit 150 is on target with a reliability target. The comparison results also indicate to the power manager 140 how to update one or more of the operational parameters 144 for the functional unit 150.

When the comparator 130 determines the received actual usage values 112 is greater than the expected usage values 114, the age tracking unit 110 provides feedback information 132 to direct the power manager 140 to increase reliability of the functional unit 150. In such a case, the feedback information 132 may indicate one or more of the operating parameters should be reduced. In on embodiment, a reliability monitor (not shown) receives the feedback information 132 and sends an indication to the parameter selector 142 to reduce the maximum values for the operating parameters 144. These indications use one or more of commands, indications, flags, or computed values used to adjust the operational parameters 144. The reduced maximum values used by the parameter selector 142 causes the parameter selector 142 to select parameters which reduce power consumption by the functional unit 150. The reduced maximum values and the resulting selected operating parameters sent to the functional unit 150 reduce wear on the functional unit 150, and thus increase reliability of the functional unit 150.

In contrast to the above, when the comparison result from the comparator 130 indicates the received actual usage values 112 are less than the expected usage values 114, the age tracking unit 110 provides feedback information 132 for use by the power manager 140 indicating a performance boost is available. The information sent from the age tracking unit 110 to the power manager 140 indicates maintaining or increasing maximum values for one or more of the operating parameters.

Figure 2:
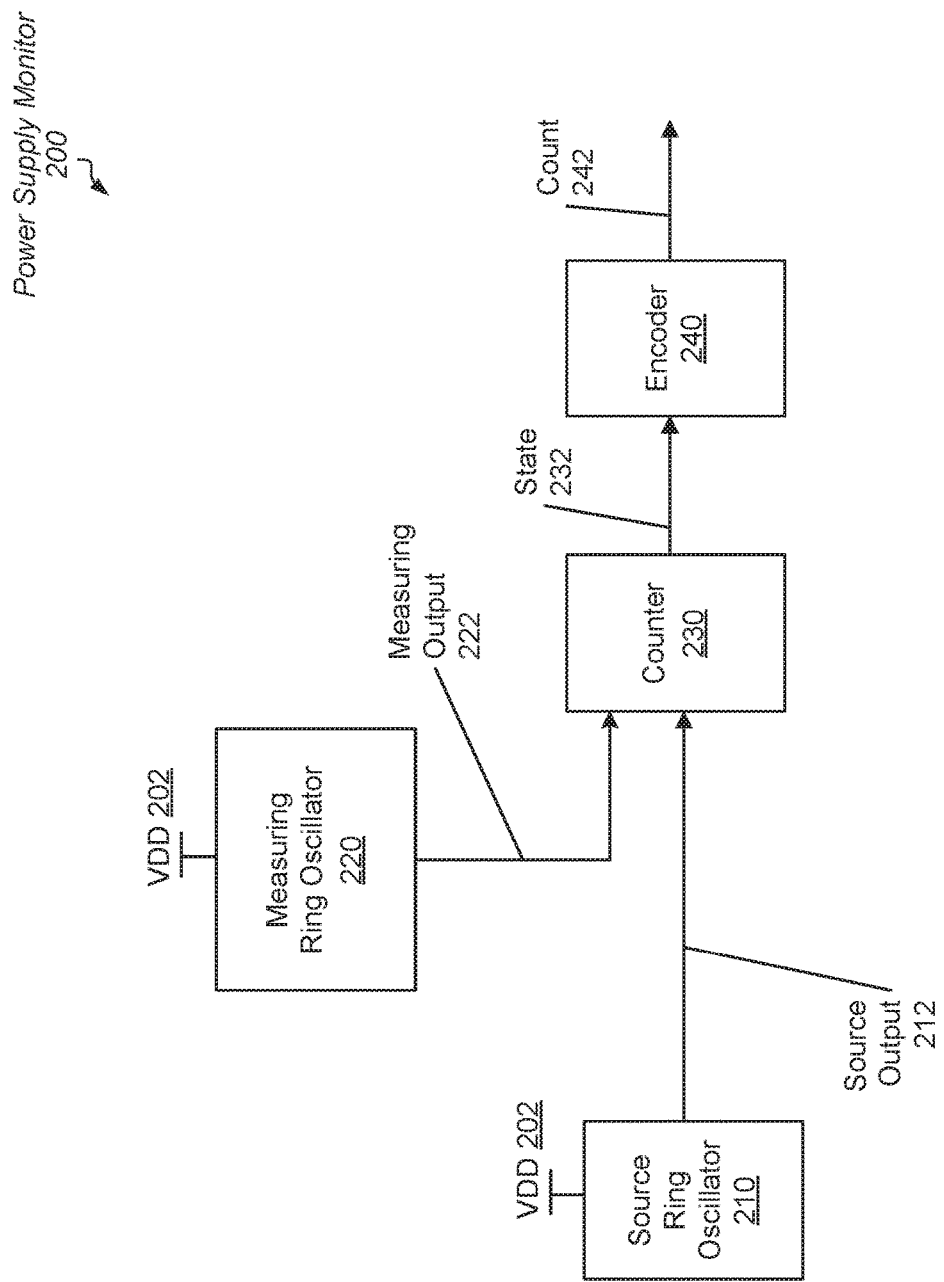
FIG. 2 is a generalized diagram of one embodiment of a power supply monitor.

Turning now to FIG. 2, a generalized block diagram of one embodiment of a power supply monitor 200 is shown. The power supply monitor 200 measures an operational voltage reference in a particular region of an integrated circuit. The power supply monitor 200 receives a power supply reference such as the power supply voltage "VDD" 202. The power supply monitor 200 generates the count 242, which indicates a measurement of a power supply voltage of VDD 202. The power supply monitor 200 may also be referred to a time-to-digital converter (TDC). As shown, the power supply monitor 200 uses a source ring oscillator 210, a measuring ring oscillator 220, a counter 230 and an encoder 240. It is noted that the power supply monitor 200 foregoes use of a clock signal derived from an output of a phase locked loop (PLL) or other clock generating circuitry.

The counter 230 counts a number of rising edges and falling edges of the output stage of the measuring ring oscillator 220, which is indicated as measuring output 222. The sequential elements of the counter 230 use the rising edges and falling edges of the output stage of the source ring oscillator 210, which is indicated as source output 212, as a clock input signal. Therefore, the power supply monitor 200 reduces the dependence on temperature variations for the power supply measurement. Additionally, the power supply monitor 200 removes dependence on jitter of a clock signal generated by clock generating circuitry. Further, the power supply monitor 200 foregoes use of a reference power supply. The encoder 240 receives the output state, which is indicated as state 232, from the counter 230, and converts the state information into a binary count value, which is indicated as count 242. The encoder sends the count 242 to external circuitry such as an external age tracking unit. The age tracking unit sends control signals to a power manager, which either maintains or updates operating parameters of the region of the integrated circuit using the power supply monitor 200.

Generally speaking, each of the source ring oscillator 210 and the measuring ring oscillator 220 uses a number of serially connected inverters with a feedback connection between the output stage and the initial stage. Each of the source ring oscillator 210 and the measuring ring oscillator 220 uses one of a variety of ring oscillator designs. In some designs, one or more of the source ring oscillator 210 and the measuring ring oscillator 220 uses cross-coupled combinatorial logic gates. In other designs, one or more of the source ring oscillator 210 and the measuring ring oscillator 220 uses a combination of serially connected inverters, cross-coupled combinatorial logic gates, stand-alone transistors connected between nodes or voltage references and the inverters and logic gates. In yet other designs, one or more of the source ring oscillator 210 and the measuring ring oscillator 220 uses additional passive elements such as resistors and capacitors placed among serially connected inverters and any cross-coupled logic gates. In one example, the source ring oscillator 210 uses a one stack ring oscillator type while the measuring ring oscillator 220 uses a two stack ring oscillator type.

Each of the source ring oscillator 210 and the measuring ring oscillator 220 receives the power supply voltage VDD 202, and begins generating toggling signals on intermediate nodes and an output node. These toggling signals have rising edges and falling edges. A "revolution" of a ring oscillator may be referred to when a rising edge or falling edge occurs on the output node of the output stage of the ring oscillator. The rising edge or falling edge occurs when an edge transition traverses each stage from the initial stage to the output stage (final stage) of the ring oscillator. Each revolution is one of the phases of the output signal of the measuring ring oscillator 220. For example, a high phase on the output of the measuring ring oscillator 220 occurs between a rising edge and a falling edge on the output of the measuring ring oscillator 220. A low phase on the output of the measuring ring oscillator 220 occurs between a falling edge and a rising edge on the output of the measuring ring oscillator 220. Therefore, a complete cycle, or time period, on the output of the measuring ring oscillator 220 includes two revolutions on the output of the measuring ring oscillator 220. Similarly, a complete cycle, or time period, on the output of the source ring oscillator 210 includes two revolutions on the output of the source ring oscillator 210.

The counter 230 measures the number of revolutions of the measuring ring oscillator 220 within a time period. In various embodiments, this time period is two revolutions of the source ring oscillator 210. For example, when the sequential elements of the counter 230 are positive edge sequential elements, the sequential elements use a time period between two rising edges of the source output 212. However, when the sequential elements of the counter 230 are negative edge sequential elements, the sequential elements use a time period between two falling edges of the source output 212. The counter 230 uses one of a variety of counters for ring oscillators. For example, the counter 230 uses one of a variety of linear feedback shift registers (LFSRs), asynchronous counters, or ripple counters. Examples of the sequential elements are one of a variety of flip-flop circuits and latches.

As shown, rather than use a clock signal provided by clock generating circuitry, such as a phase locked loop (PLL) or other, the power supply monitor 200 uses the source output 212 from the source ring oscillator 210 as a clock signal for the sequential elements of the counter 230. Therefore, the power supply monitor 200 is capable of measuring the power supply voltage of VDD 202 while reducing temperature dependence and removing clock jitter from affecting the measurement. Additionally, as soon as a power supply voltage is applied to VDD 202, the power supply monitor 200 begins measuring VDD 202 and storing the state 232 in sequential elements of the counter 230 without needing to wait for a received clock signal from clock generating circuitry.

The encoder 240 receives the output state, which is indicated as state 232, from the counter 230, and converts the state information into a binary count value, which is indicated as count 242. The encoder sends the count 242 to external circuitry such as an external age tracking unit. The count 242 indicates a measurement of the power supply VDD 202. In one example, during testing, designers determined a count of 700 is associated with VDD 202 being 1.1 volts (V). When the external age tracking unit receives a count of 698, the age tracking unit determines a difference of 2 between the received measured value (e.g., 698) and an expected value (e.g., 700). When the difference is less than or equal to a threshold (e.g. 20), the age tracking unit informs a power manager to maintain current operating parameters for a region of the integrated circuit using the power supply monitor 200. Therefore, the power manager maintains a current operating clock frequency and maintains VDD 202 at 1.1V.

If the age tracking unit receives the count 242 with a value of 667, then the age tracking unit determines a difference of 33 between the received measured value (e.g., 667) and the expected value (e.g., 700). When the difference is greater than a threshold (e.g., 20), the age tracking unit informs a power manager to update current operating parameters for the region of the integrated circuit using the power supply monitor 200. In some designs, the age tracking unit compares the difference to multiple thresholds to determine between which two thresholds is located the difference. In one example, the difference 33 indicates that VDD 202 is near 1.05V or nearly 5% below the expected 1.1V. Therefore, the power manager updates VDD 202 to be 1.15V, so that the region of the integrated circuit using the power supply monitor 200 and experiencing aging effects provides a power supply voltage of 1.1V for VDD 202. In some embodiments, the count 242 is stored along with a timestamp and this information is used to provide further updates to the operational parameters and debugging power-performance states (P-states) and multiple idle states of the functional unit 150.

Figure 3:
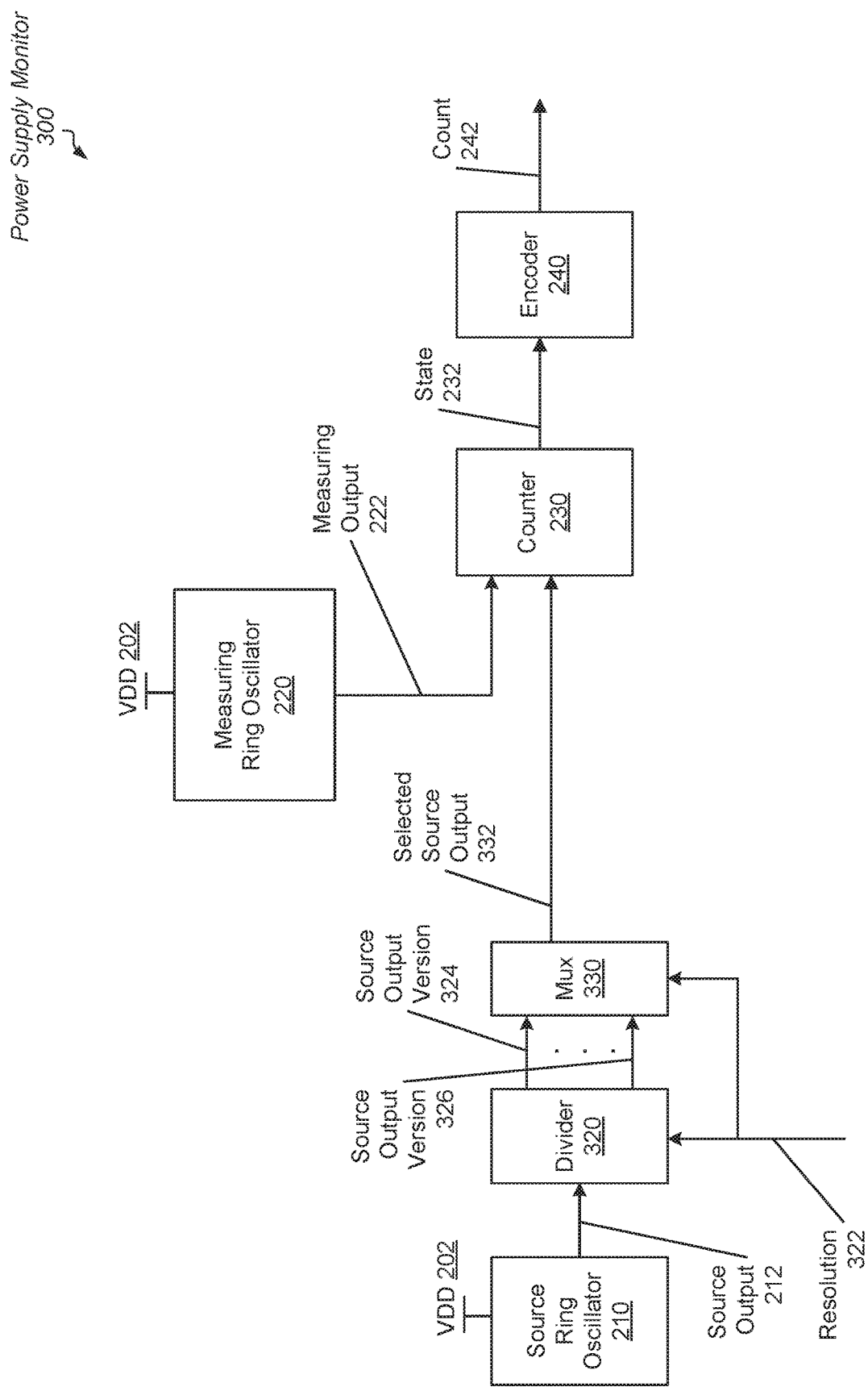
FIG. 3 is a generalized diagram of one embodiment of a power supply monitor.

Referring to FIG. 3, a generalized block diagram of one embodiment of a power supply monitor 300 is shown. Circuitry previously described is numbered identically. The power supply monitor 300 uses components of the power supply monitor 200 and additional components such as the divider 320 and multiplexer (mux) 330. Rather than send the source output 212 from the source ring oscillator 210 to the counter 230, the counter 230 receives the selected source output 332.

The sequential elements of the counter 230 use the selected source output 332 as a clock signal input, rather than a clock signal from clock generating circuitry such as a PLL or other circuitry using a crystal or other source generating a periodic signal toggling between a binary logic high value and a binary logic low value. The divider 320 receives the source output 212. The divider 320 is capable of sending the source output 212 as one of the one or more output signals indicated as source output version 324-326. Although two output signals are shown from the divider 320, any number of outputs are possible. For example, the divider 320 receives the source output 212 and is also capable of generating one or more output signals with a period greater than the period of the source output 212. For example, the divider 320 is capable of generating an output signal with a period N times greater than the period of the source output 212. Here, N is a positive, non-zero integer.

In some embodiments, the divider 320 generates multiple output signals, such as source output version 324-326, and the multiplexer (mux) 330 selects one based on the received control signal resolution 322. In another embodiment, the divider 320, based on the received control signal resolution 322, generates a single output signal with a period N times greater than the period of the source output 212. Here, N is based on the received control signal resolution 322. In such embodiments, the mux 330 is not used and the output of the divider 320 is directly received by the sequential elements of the counter 230.

By increasing the period of the source output 212 by N for the selected source output 332, the power supply monitor 300 divides the frequency of the source output 212 and increases the resolution provided by the count 242. In one example, during testing, designers determined a count of 700 is associated with VDD 202 being 1.1 volts (V). However, if the period of selected source output 332 is double the period of source output 212, then a count of 1,400 is associated with VDD 202 being 1.1 volts (V) and the resolution of the power supply monitor 300 is increased. The control signal resolution 322 indicates the period of selected source output 332 is double the period of source output 212. If the period of selected source output 332 is quadruple the period of source output 212, then a count of 2,800 is associated with VDD 202 being 1.1 volts (V) and the resolution of the power supply monitor 300 is further increased. The control signal resolution 322 indicates the period of selected source output 332 is quadruple the period of source output 212.

By basing the clock input of sequential elements of the counter 230 on the source output 212 of the source ring oscillator 210, the power supply monitors 200, 300 and 400 (when using the selected source output 332) provide a measurement of an operational voltage reference that is independent of an operating temperature, a reference clock from clock generating circuitry, and circuit aging effects. In various embodiments, the source ring oscillator 210 and the measuring ring oscillator 220 use transistors with a same threshold voltage, which aids temperature independence. Since the power supply monitors 200 and 300 are temperature independent, no adjustment or conversion based on operational temperature is performed on the output count 242.

Figure 4:
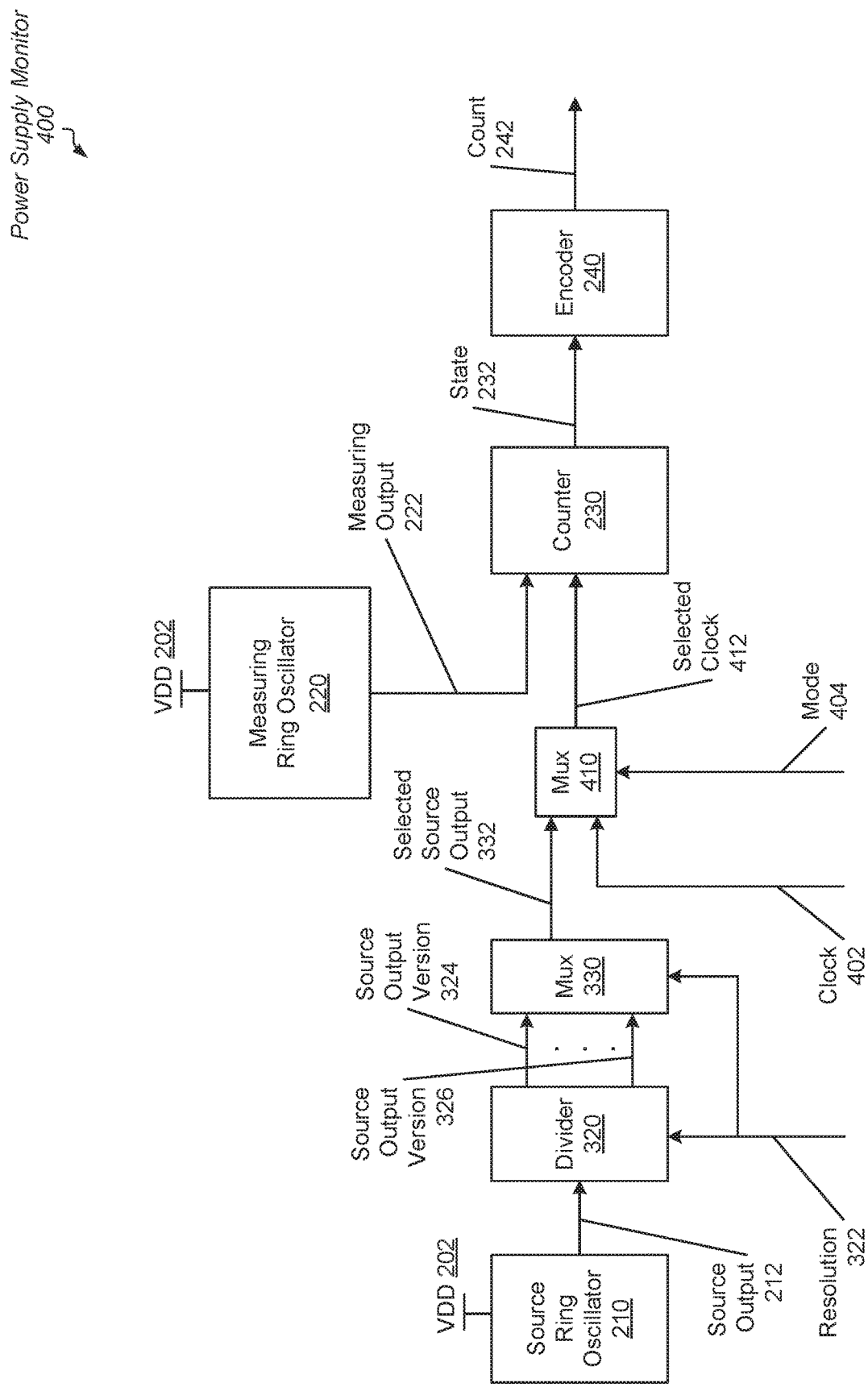
FIG. 4 is a generalized diagram of one embodiment of a power supply monitor.

By being independent of a reference clock signal from clock generating circuitry, such as a PLL, the output count 242 of each of the power supply monitors 200, 300 and upcoming 400 (when using the selected source output 332) described shortly in FIG. 4 is independent of clock jitter. In addition, for functional units that use an adaptive clocking mechanism that adjusts the operational clock frequency based on measured voltage droop, the output count 242 of the power supply monitors 200, 300 and 400 continues to provide a dependable measurement of the operational voltage reference. Further, the power supply monitors 200, 300 and 400 are capable of providing a measurement of an operational voltage reference as soon as the power supply voltage rail(s) are operational and charged, since the power supply monitors 200, 300 and 400 are independent of any reference clock signal from clock generating circuitry. Further still, the power supply monitors 200, 300 and 400 are capable of providing a measurement of an operational voltage reference during power up operations and power down operations. These measurements made during the power up and power down operations can be stored and later analyzed for power supply debugging steps. The counts from these measurements can be stored in one or more of registers, a cache memory subsystem and non-volatile memory. It is possible to perform measurements during the power up and power down operations, since the power supply monitors 200, 300 and 400 are independent of any reference clock signal from clock generating circuitry.

The power supply monitors 200, 300 and 400 provide a linear relationship between the output count 242 and the power supply voltage. Therefore, it is unnecessary to use fuses, piecewise linear approaches, and/or quadratic relations to translate the output count 242 of the power supply monitors 200, 300 and 400 to a measure of an operational voltage reference. The resolution of the power supply monitors 200 and 300 can be measured as an amount of voltage difference measured per count of the power supply monitors 200 and 300. In one example, each count of the power supply monitors 200 and 300 is 15 to 25 millivolts (mV) per count. The output count 242 of the power supply monitors 200 and 300 provide a resolution that is uniform across different power supply voltages and across different semiconductor fabrication process corners. In some cases, the output count 242 of the power supply monitors 200 and 300 provide a higher resolution at higher power supply voltages.

When a different power supply monitor is used that relies on a reference clock signal from clock generating circuitry, this different power supply monitor provides measurements with non-uniform resolution and coarse resolution at higher power supply voltages. By adjusting the parameters of the source ring oscillator 210 and the measuring ring oscillator 220, the output count 242 of the power supply monitors 200 and 300 provide a more uniform resolution. Examples of these parameters are the number of stacks used in the ring oscillators, the threshold voltages of the transistors used in the ring oscillators and the fanout used for the ring oscillators.

Referring to FIG. 4, a generalized block diagram of one embodiment of a power supply monitor 400 is shown. Circuitry previously described is numbered identically. The power supply monitor 400 uses components of the power supply monitors 200 and 300 and additional components such as the multiplexer (mux) 410. Rather than send the source output 212 from the source ring oscillator 210 to the counter 230, the counter 230 receives the selected clock 412 from the mux 410. In some embodiments, the power supply monitor 400 uses a clock signal, such as clock 402, generated from clock generating circuitry, such as a PLL or other circuitry using a crystal or other source generating a periodic toggling signal. The sequential elements of the counter 230 uses either the selected source output 332 or the clock 402 as a clock signal input. The mux 410 selects between the selected source output 332 and the clock 402 based on the received control signal mode 404. When using the selected source output 332 as the selected clock 412, the power supply monitor 400 has the same characteristics as the power supply monitors 200 and 300. For example, the power supply monitor 400 provides a measurement of an operational voltage reference that is independent of an operating temperature, independent of a reference clock from clock generating circuitry, and independent of circuit aging effects. Additionally, the power supply monitor 400 can be used to perform measurements of the operational voltage reference during power up operations and power down operations, which are stored and later analyzed.

Figure 5:
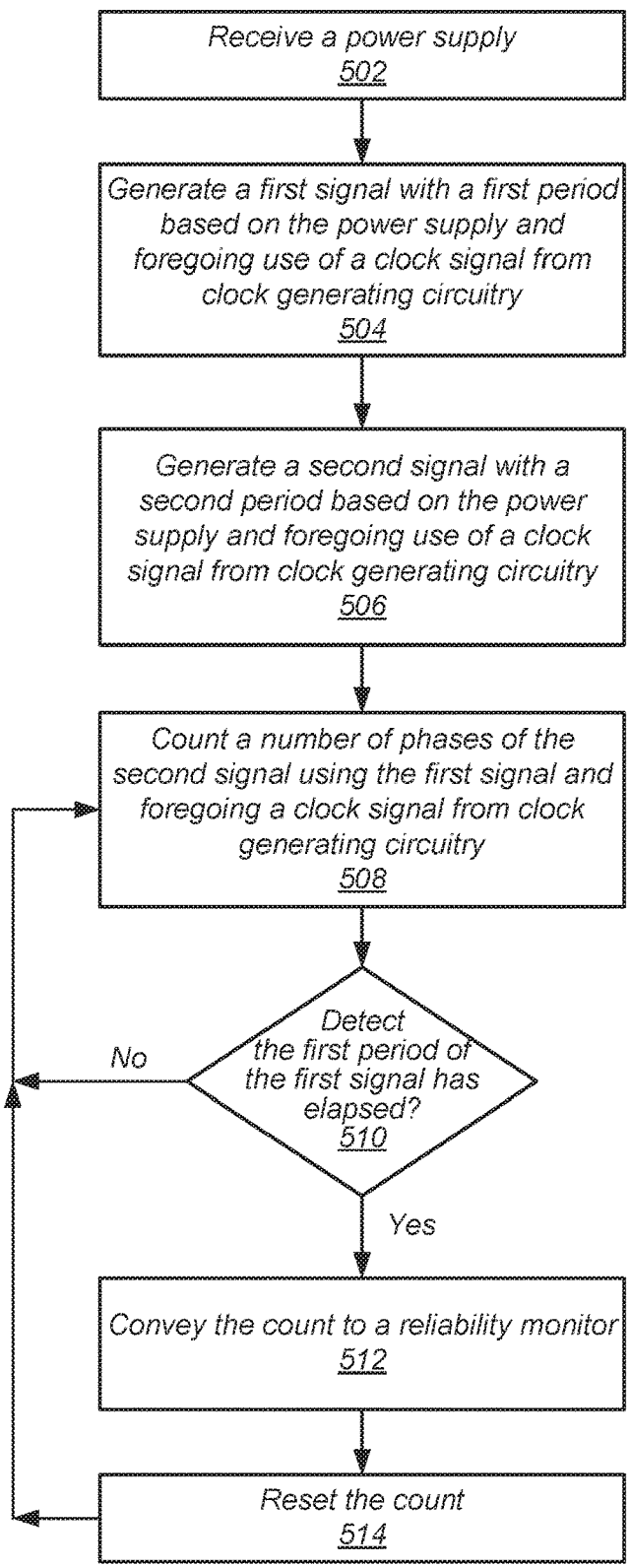
FIG. 5 is a generalized diagram of one embodiment of a method for measuring an operational voltage reference.

Referring now to FIG. 5, one embodiment of a method 500 for measuring an operational voltage reference is shown. For purposes of discussion, the steps in this embodiment (as well as in FIG. 6) are shown in sequential order. However, in other embodiments some steps occur in a different order than shown, some steps are performed concurrently, some steps are combined with other steps, and some steps are absent.

A region of an integrated circuit using a power supply monitor receives a power supply voltage (block 502). The power supply monitor generates a first signal with a first period based on the power supply and foregoing use of a clock signal from clock generating circuitry (block 504). For example, the power supply monitor uses a source ring oscillator, which generates the first signal with the first period. The power supply monitor generates a second signal with a second period based on the power supply and foregoing use of a clock signal from clock generating circuitry (block 506). For example, the power supply monitor uses a measuring ring oscillator, which generates the second signal with the second period. The source ring oscillator and the measuring ring oscillator receive the same power supply voltage. Each of the source ring oscillator and the measuring ring oscillator uses one of a variety of ring oscillator designs.

The power supply monitor uses a counter to count a number of phases (revolutions) of the second signal using a cycle, or time period, of the first signal while foregoing a clock signal from clock generating circuitry (block 508). For example, data inputs of sequential elements of the counter receive signals from one or more stages of the measuring ring oscillator. In some designs, the counter receives the output signal of the output stage (final stage) of the measuring ring oscillator, and counts a number of revolutions of the measuring ring oscillator within a time period. The clock inputs of the sequential elements of the counter receive the output signal of the output stage (final stage) of the source ring oscillator. Therefore, the counter counts a number of revolutions of the measuring ring oscillator within two revolutions (two phases) of the source ring oscillator. The two revolutions of the source ring oscillator is the measuring time period.

If the sequential elements of the counter detect the first period of the first signal has not elapsed ("no" branch of the conditional block 510), then control flow of method 500 returns to block 508 where the counter counts a number of phases (revolutions) of the second signal using a cycle of the first signal. The counter foregoes use of a clock signal from clock generating circuitry such as a PLL. If the sequential elements of the counter detect the first period of the first signal has elapsed ("yes" branch of the conditional block 510), then the power supply monitor conveys an indication of the count to an external age tracking unit (block 512). For example, the counter captures a current state at the end of the first period of the first signal, an encoder converts the state into a binary value, and the encoder sends the binary value to the age tracking unit. The counter resets (block 514), and control flow of method 500 returns to block 508 where the counter counts a number of phases (revolutions) of the second signal using a cycle of the first signal.

Figure 6:
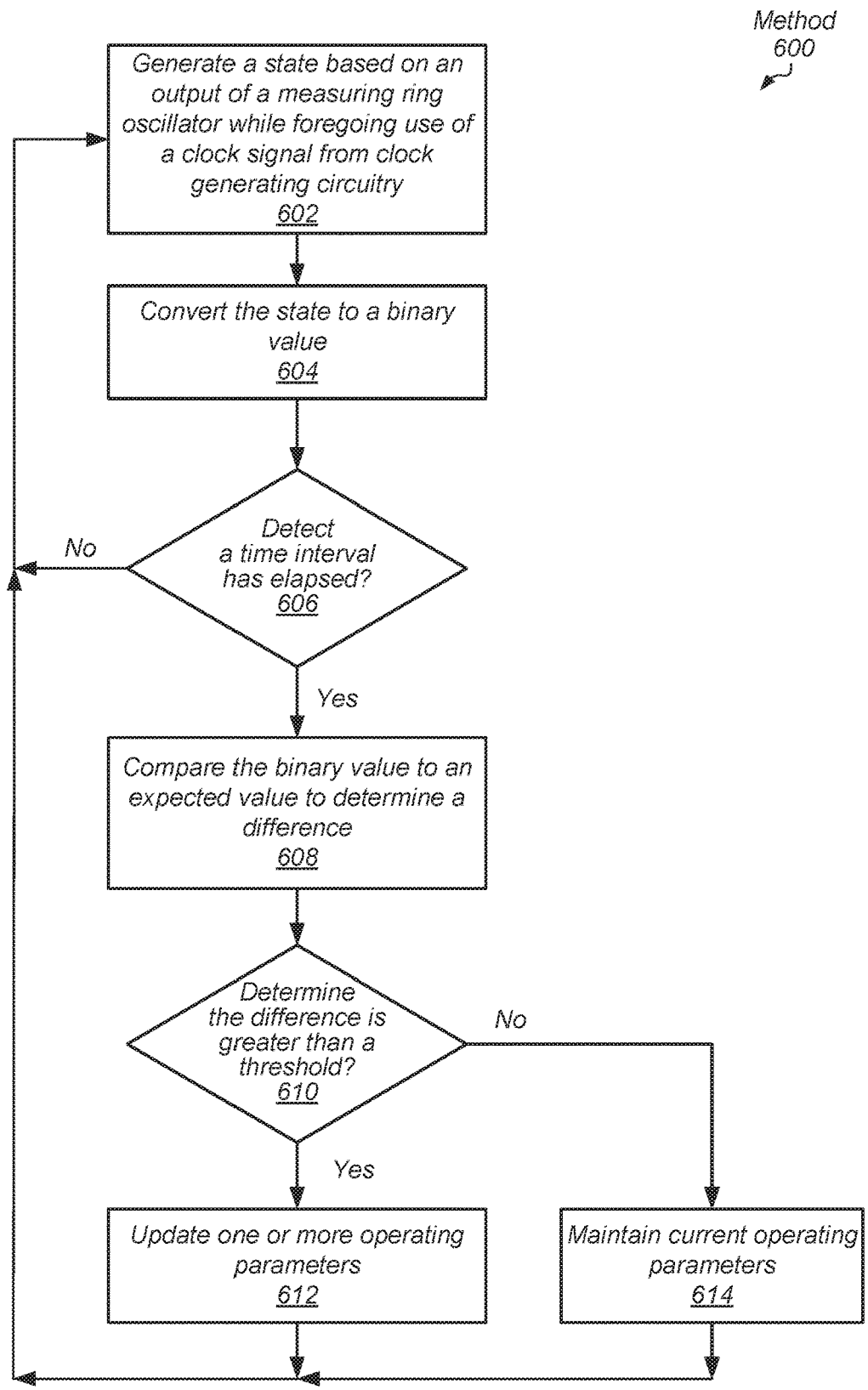
FIG. 6 is a generalized diagram of one embodiment of a method for providing operating parameters based on measured power supply variations.

Turning now to FIG. 6, one embodiment of a method 600 for providing operating parameters based on measured power supply variations is shown. A power supply monitor of a particular region of an integrated circuit generates a state based on an output of a ring oscillator while foregoing use of a clock signal from clock generating circuitry (block 602). For example, any one of the power supply monitors 200, 300 and 400 (of FIGS. 2, 3 and 4) may be used. Therefore, a counter of the measuring ring oscillator receives the state on data inputs of sequential elements of the counter, while the counter receives the output of a source ring oscillator on clock inputs of the sequential elements of the counter. The state is associated with a number of revolutions of the measuring ring oscillator of the power supply monitor.

The power supply monitor converts the state to a binary value (block 604). In various embodiments, sequential elements of an age tracking unit receive the binary value and store the received binary value when a clock period used by the age tracking unit has elapsed. In some embodiments, this clock period is stored in a programmable configuration register and used to determine how often to update operating parameters of the integrated circuit. In other embodiments, this clock period is based on a duration of revolutions of a source ring oscillator of the power supply monitor. In an embodiment, the age tracking unit collects multiple binary values form the power supply monitor before its time interval has elapsed.

If the time interval of the age tracking unit has not elapsed ("no" branch of the conditional block 606), then control flow of method 600 returns to block 602 where the power supply monitor generates the state based on the measuring ring oscillator while foregoing use of a clock signal from clock generating circuitry. If the time interval of the age tracking unit has elapsed ("yes" branch of the conditional block 606), then the age tracking unit, or other circuitry, compares the binary value to an expected value to determine a difference (block 608). If the difference is greater than a threshold ("yes" branch of the conditional block 610), then a power manager, or other circuitry, updates one or more operating parameters of the integrated circuit (block 612). Otherwise, if the difference is less than or equal to a threshold ("no" branch of the conditional block 610), then the power manager, or other circuitry, maintains current values for one or more operating parameters of the integrated circuit (block 614).

Figure 7:
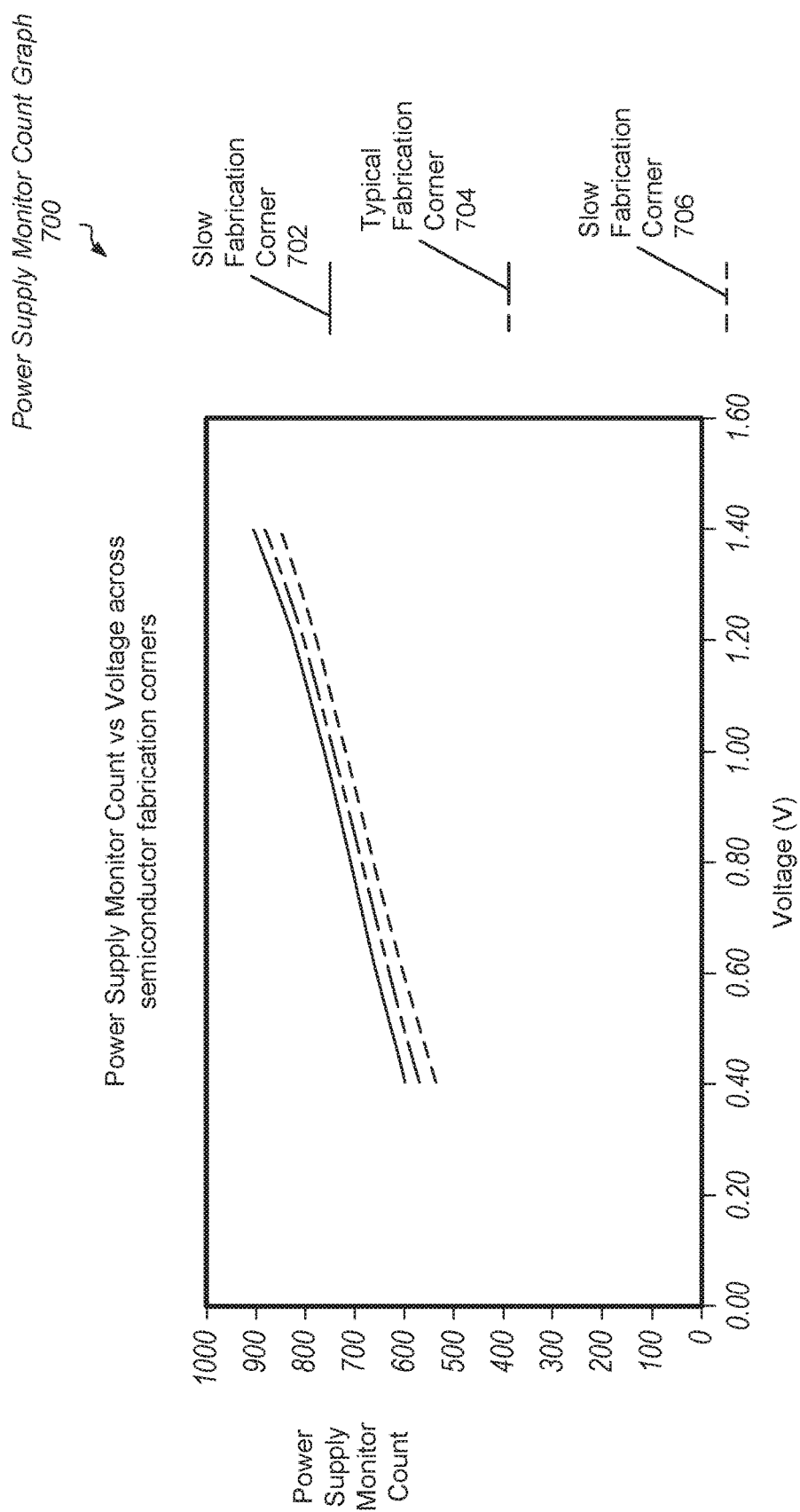
FIG. 7 is a generalized diagram of one embodiment of a graph of power supply monitor count versus power supply voltage.

Referring to FIG. 7, a generalized block diagram of one embodiment of a graph 700 of power supply monitor count versus power supply voltage is shown. Graphs of the output count of a power supply monitor versus a power supply voltage are shown. The power supply monitor can be any one of the power supply monitors 200, 300 and 400 using the output of the source ring oscillator 210 as a clock input signal. One graph is shown for each of a slow semiconductor fabrication process corner 702, a typical (nominal) semiconductor fabrication process corner 704, and a fast semiconductor fabrication process corner 706.

The semiconductor fabrication process corners (or process corners) include a variety of parameters to adjust in order to characterize behavior of devices (transistors) and to characterize behavior of a functional unit under varying conditions. Examples of these parameters are an operational voltage, an operational clock frequency, threshold voltages of devices (transistors), and an operating temperature. The graphs illustrate a linear relationship between the output count of the power supply monitor and the power supply voltage. Therefore, it is unnecessary to use fuses, piecewise linear approaches, and/or quadratic relations to translate the output count of the power supply monitor to a measure of an operational voltage reference. It is noted that the output count ranges of the power supply monitor is similar across the different process corners 702-706.

Figure 8:
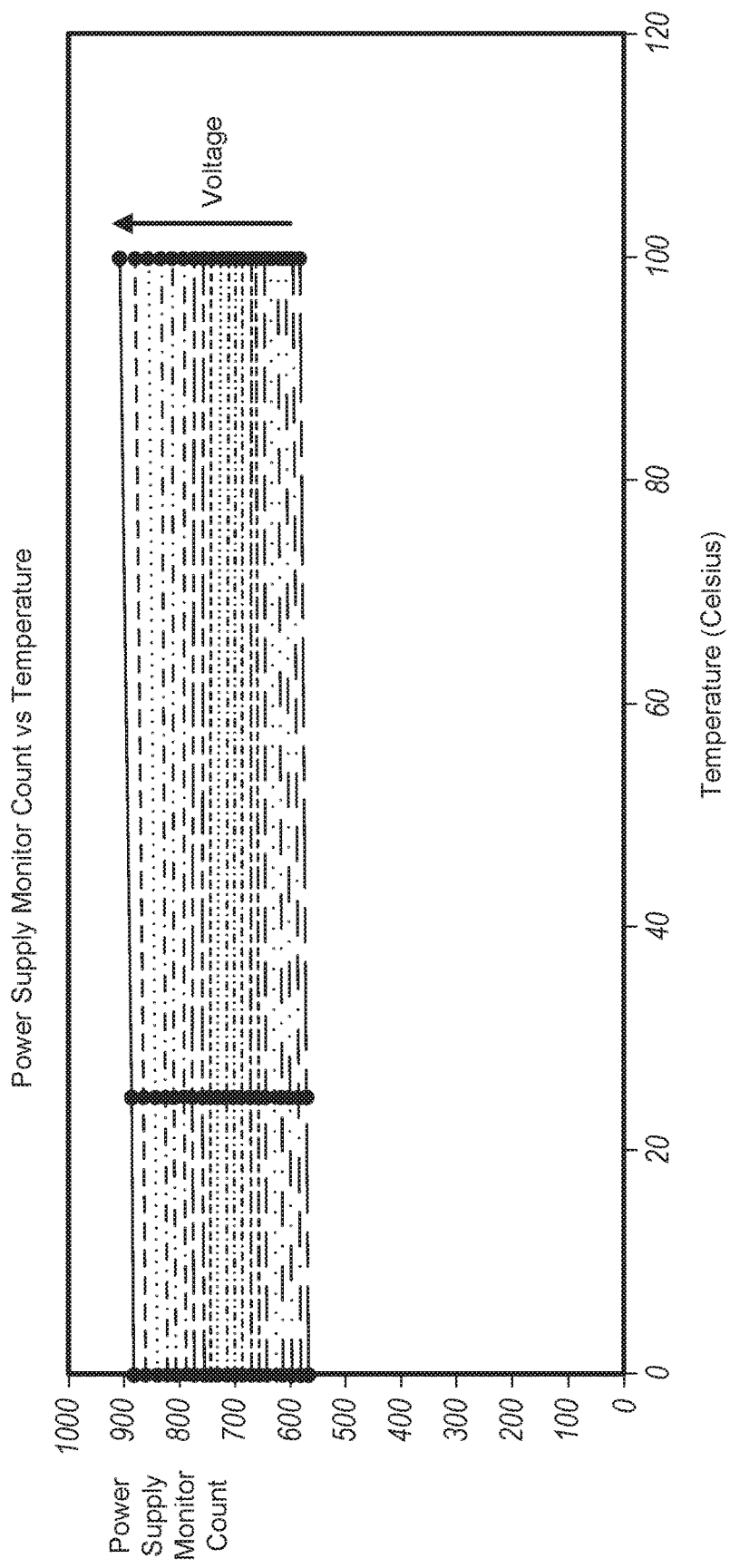
FIG. 8 is a generalized diagram of one embodiment of a graph of power supply monitor count versus operational temperature.

Turning now to FIG. 8, a generalized block diagram of one embodiment of a graph 800 of power supply monitor count versus operational temperature is shown. Graphs of the output count of a power supply monitor versus operational temperature measured in Celsius are shown. The power supply monitor can be any one of the power supply monitors 200, 300 and 400 using the output of the source ring oscillator 210 as a clock input signal. As shown, the output count of the power supply monitor is independent of operational temperature. Therefore, it is unnecessary to convert the output count of the power supply monitor based on operational temperature. As descried earlier, in various embodiments, the source ring oscillator 210 and the measuring ring oscillator 220 of the power supply monitor use transistors with a same threshold voltage, which aids temperature independence.

Figure 9:
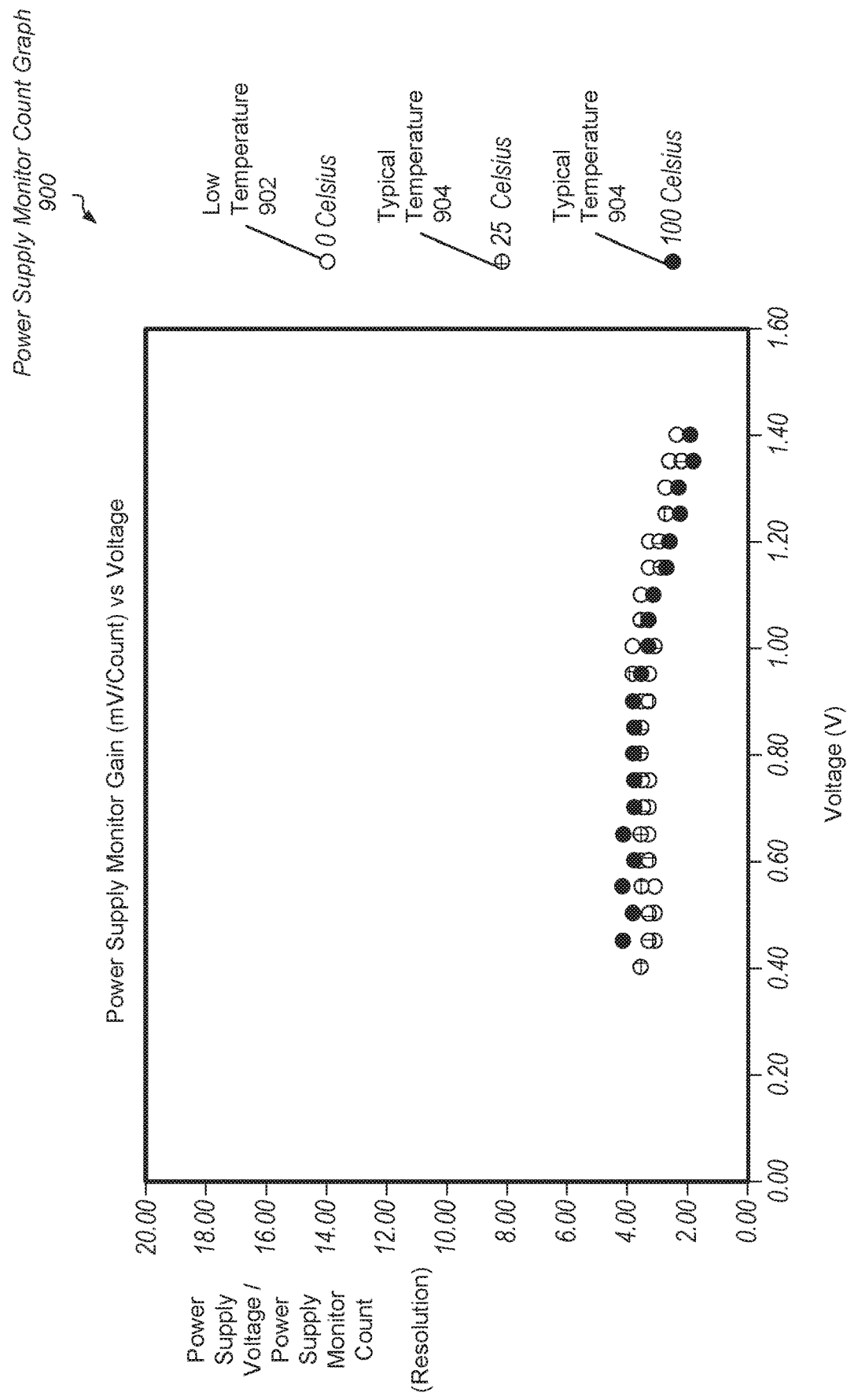
FIG. 9 is a generalized diagram of one embodiment of a graph of power supply monitor count resolution.

Referring to FIG. 9, a generalized block diagram of one embodiment of a graph 900 of power supply monitor resolution is shown. Graphs of a ratio of the power supply voltage to the output count of a power supply monitor versus a power supply voltage are shown. The power supply monitor can be any one of the power supply monitors 200, 300 and 400 using the output of the source ring oscillator 210 as a clock input signal. The ratio may also be referred to as the resolution of the power supply monitor. One graph is shown for each of a low operational temperature 902, a typical (nominal) operational temperature 904, and a high operational temperature 906. The operational temperatures are measured in Celsius. The graphs are derived at a typical (nominal) process corner, but similar relationships are shown for other process corners.

Typically, resolution suffers in prior power supply monitors due to diminishing device (transistor) delay as the power supply voltage increases. However, the power supply monitors 200, 300 and 400 (of FIGS. 2, 3 and 4) use the output of the source ring oscillator 210 as a clock input signal, so this "clock" signal tracks the diminishing device (transistor) delay as the power supply voltage increases. Therefore, the clock period of this "clock" signal from the source ring oscillator 210 changes as the device delays of surrounding circuitry also changes. By adjusting the parameters of the source ring oscillator 210 and the measuring ring oscillator 220, the output count 242 of the power supply monitors 200, 300 and 400 provide a more uniform resolution. Examples of these parameters are the number of stacks used in the ring oscillators, the threshold voltages of the transistors used in the ring oscillators and the fanout used for the ring oscillators.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An apparatus comprising:
a first ring oscillator configured to generate a first signal with a first period based on a received power supply;
a second ring oscillator configured to generate a second signal with a second period based on the received power supply;
a counter configured to count a number of cycles of the second signal within the first period of the first signal; and
circuitry configured to convey the count to an external age tracking unit configured to compare the count to an expected count, based at least in part on a determination that the first period has elapsed.

2. The apparatus as recited in claim 1, wherein the counter is configured to use the first signal as a clock signal input.

3. The apparatus as recited in claim 2, wherein the circuitry is further configured to convey the count prior to a clock signal being generated by clock generating circuitry.

4. The apparatus as recited in claim 1, wherein the apparatus further comprises an encoder, wherein:
the counter is further configured to store, in a plurality of sequential elements, a state of one or more stages of the second ring oscillator using the first signal in place of a clock signal input, wherein the state comprises an indication of the number of cycles of the second signal within the first period of the first signal; and
the encoder is configured to convert the state to a binary value indicating the number of cycles of the second signal within the first period of the first signal.

5. The apparatus as recited in claim 1, wherein the apparatus further comprises a divider configured to:
receive the first signal; and
generate a third signal with a third period N times greater than the first period of the first signal, wherein N is a positive, non-zero integer.

6. The apparatus as recited in claim 5, wherein the apparatus further comprises circuitry configured to:
select between the first signal and the third signal; and
convey the selected signal to the counter to use as a clock signal input.

7. The apparatus as recited in claim 1, wherein the first ring oscillator is a one stack ring oscillator and the second ring oscillator is a two stack ring oscillator.

8. A method comprising:
generating, by a first ring oscillator, a first signal with a first period based on a received power supply;
generating, by a second ring oscillator, a second signal with a second period based on the received power supply;
counting, by a counter, a number of cycles of the second signal within the first period of the first signal; and
conveying, by circuitry, the count to an external age tracking unit configured to compare the count to an expected count, based at least in part on a determination that the first period has elapsed.

9. The method as recited in claim 8, further comprising using, by the counter, the first signal as a clock signal input.

10. The method as recited in claim 8, further comprising resetting the counter, in response to determining the first period of the first signal has elapsed.

11. The method as recited in claim 8, further comprising:
storing a state of one or more stages of the second ring oscillator using the first signal in place of a clock signal input, wherein the state comprises an indication of the number of cycles of the second signal within the first period of the first signal; and
converting the state to a binary value indicating the number of cycles of the second signal within the first period of the first signal.

12. The method as recited in claim 8, further comprising:
receiving, by a divider, the first signal; and
generating, by the divider, a third signal with a third period N times greater than the first period of the first signal, wherein N is a positive, non-zero integer.

13. The method as recited in claim 12, further comprising:
selecting between the first signal and the third signal; and
conveying the selected signal to the counter to use as a clock signal input.

14. The method as recited in claim 8, wherein the first ring oscillator is a one stack ring oscillator and the second ring oscillator is a two stack ring oscillator.

15. The method as recited in claim 11, further comprising:
updating one or more operating parameters, in response to determining a difference between the binary value and an expected value is greater than a threshold; and
maintaining the one or more operating parameters, in response to determining the difference is less than or equal to the threshold.

16. A circuit comprising:
a processor core; and
power supply monitor comprising:

a first ring oscillator configured to generate a first signal with a first period based on a received power supply;

a second ring oscillator configured to generate a second signal with a second period based on the received power supply;

a counter configured to count a number of cycles of the second signal within the first period of the first signal; and circuitry configured to convey the count to an external age tracking unit configured to compare the count to an expected count, based at least in part on a determination that the first period has elapsed.

17. The circuit as recited in claim 16, wherein the counter is configured to use the first signal as a clock signal input.

18. The circuit as recited in claim 16, wherein the circuitry comprises a divider configured to:

receive the first signal; and generate a third signal with a third period N times greater than the first period of the first signal, wherein N is a positive, non-zero integer.

19. The circuit as recited in claim 18, wherein the circuitry is further configured to:

select between the first signal and the third signal; and convey the selected signal to the counter to use as a clock signal input.

20. The circuit as recited in claim 16, wherein the first ring oscillator is a one stack ring oscillator and the second ring oscillator is a two stack ring oscillator.

\* \* \* \* \*